Figure 1A:
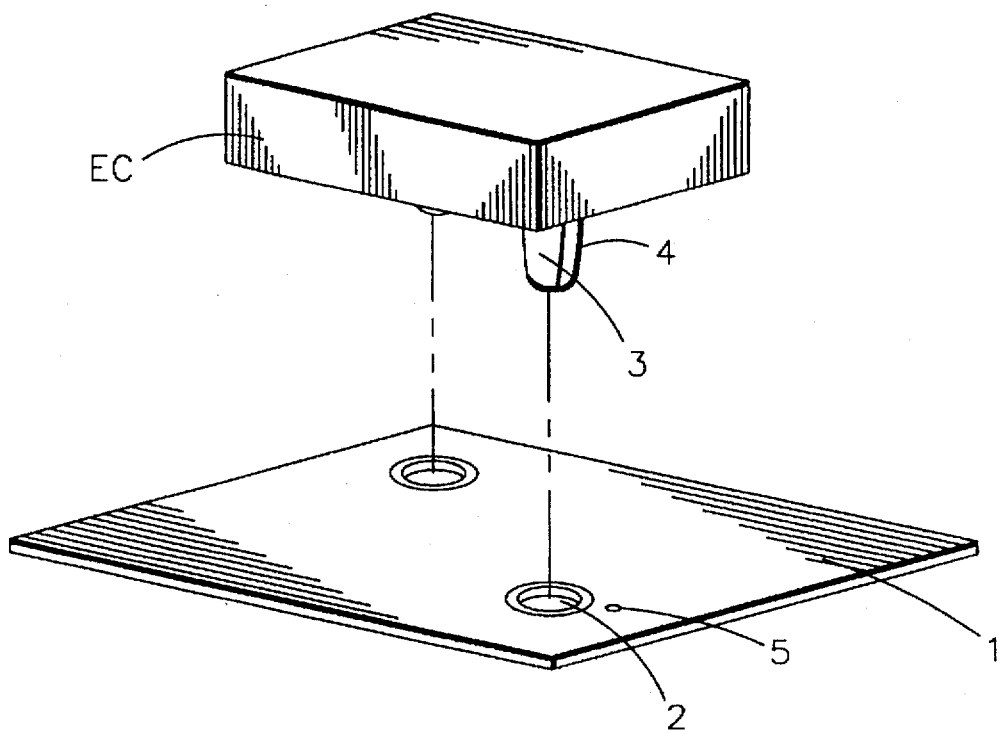

United States Patent [19]

Lonka et al.

[11] Patent Number: 5,742,488
[45] Date of Patent: Apr. 21, 1998

[54] SHIELDING DEVICE AND METHOD OF MOUNTING

[75] Inventors: Pekka Lonka, Salo; Kari Aittokangas, Kaarina, both of Finland

[73] Assignee: Nokia Mobile Phones Limited, Salo, Finland

[21] Appl. No.: 524,325

[22] Filed: Sep. 6, 1995

[30] Foreign Application Priority Data

Sep. 7, 1994 [FI] Finland ................. 944108

[51] Int. Cl.$^6$ ............................... H05K 9/00
[52] U.S. Cl. ............. 361/816; 361/818; 361/748; 174/35 R; 174/35 GC
[58] Field of Search ............... 361/816, 818, 361/736, 741, 751, 807, 809, 810, 753, 799; 174/35 R, 35 GC, 51, 52.1, 53, 59, 66; 439/341, 61, 76.1, 567

[56] References Cited

U.S. PATENT DOCUMENTS

| 4,370,515 | 1/1983 | Donaldson | 174/35 R |
|---|---|---|---|
| 5,014,160 | 5/1991 | McCoy, Jr. | 361/424 |
| 5,095,177 | 3/1992 | Johnson | 174/35 R |
| 5,257,947 | 11/1993 | Scheer et al. | 439/567 |
| 5,365,410 | 11/1994 | Lonka | 361/816 |
| 5,400,949 | 3/1995 | Hirvonen et al. | 228/180.22 |
| 5,442,521 | 8/1995 | Hirvonen et al. | 361/800 |
| B1 5,095,177 | 8/1994 | Johnson | 174/35 R |

FOREIGN PATENT DOCUMENTS

| 9318909.5 | 5/1995 | Germany. |
|---|---|---|
| WO 91/15939 | 10/1991 | WIPO. |

OTHER PUBLICATIONS

Finnish Office Action and English Translation thereof, dated 31 May 1995 Nokia Mobile Phones Ltd., Application No. 944108.

*Primary Examiner*—Leo P. Picard
*Assistant Examiner*—David Foster
*Attorney, Agent, or Firm*—Perman & Green, LLP

[57] ABSTRACT

The invention relates to a method for attaching an EMC protective casing to a circuit board and to an EMC protective casing. The fastening method according to the invention is based on convex pins (3) in a metal casing (7), which are pressed into metal-coated openings (2) in the circuit board (1). The arrangement according to the invention is applicable as a protection against interference in portable mobile phones.

14 Claims, 3 Drawing Sheets

SHIELDING DEVICE AND METHOD OF MOUNTING

The invention relates to a shielding device, particularly for the purposes of electromagnetic compatibility in a portable electronic apparatus, and a method for attaching said shielding device to a circuit board. The invention further relates to electromagnetic compatibility and to interference suppression in portable mobile phones.

EMC (electromagnetic compatibility) has been defined as the capacity of electronic devices and systems to maintain such useful signal and interference signal level and frequency ratios as not to affect their performance too much when simultaneously used for their purpose under acceptable circumstances.

Tightening EMC requirements also imply higher requirements on electrical and telecommunication devices: the devices shall resist interferences of a specific type and level, and on the other hand, they must not cause excessive interference in their environment.

In view of electromagentic protection, portable mobile phones must be provided with integrated casings to reduce emission from a radiating object and to enhance radiation resistance of sensitive elements. In prior art mobile phone designs, EMC protection of the electronics of the device has usually been accomplished with separate metal sheets and casings, or metal-coated plastic casings. Such an EMC protective casing will usually enclose a number of components, so that the casing must be opened to make these components available for service and repair.

To provide access to components inside an EMC protective casing, it is known to fasten the casing edges with separate screws to the circuit board, thereby establishing galvanic contact between the board and the casing. However, such a known design has the inconvenience that mechanical tolerances may entail poor contact between the EMC protective casing, fastened with screws, and the circuit board. In addition, oxidation of the contacting conductive surfaces and unexpected high-frequency characteristics that may be inherent to some oxidation products formed on or near said surfaces may render the galvanic and/or the thermal conductivity to the EMC protective casing inadequate. In this situation, the EMC protective casing or part of it will act as a high-frequency resonator element and start emitting or receiving radiation. This means that the protective effect of the EMC protective casing will be completely or partly lost. Impaired thermal conductivity between the circuit board and the EMC casing is also critical, because it may lead to large thermal gradients which stress the fastening.

In practical operation, several components being enclosed in the casing of the phone unit, the inconvenience described above will have a great impact. In EMC protective casings fastened with screws, oxidation affects reliablility and performances may be impaired by internal interferences. What is more, EMC protective casings are extremely difficult to open. Screw fastening is too awkward in production, small screws being difficult components to handle.

Another previously known way of attaching and detaching an EMC protective casing is to use a separate sheet metal cover soldered by robots. In current configurations, the use of soldered sheet metal as an EMC protection for electronics involves the drawback of rather inconvenient checking and repair of the solder joint. Metal-coated plastic casings require metal fastenings, which in turn must be fastened by soldering to the circuit board. Such a way of attaching and detaching an EMC protective casing is indeed far too slow.

A further drawback of this previously known design is that manufacturing a separate cover and attaching it to its frame entail material and labour costs. Moreover, a separate cover represents an additional component in the mobile phone, whose handling and maintenance causes extra costs. In fact, only very few EMC casings actually require opening for service and repair. For this reason, most of the separate covers will be superfluous components, which are never opened during the life cycle of the mobile phone. With separate covers, reliability is affected by oxidation and the increased number of components, and performances may be impaired by internal interferences. Separate covers are also difficult to open.

The present invention provides an EMC shielding device, and a method of fastening it to a circuit board, that are superior to the prior art solutions. The invention is based on a conductive shielding component comprising a number of specially designed pins, which are directed into respective conductively coated openings in the circuit board. The pins are formed in an integrated fabrication phase of the shielding component, so there will be no separate fastening means. Each pin is generally conical or convex in shape and comprises a protrusion that forms an outwards protruding bulge on one side of the pin. Said protrusion is urged against the inner surface of the respective opening in the circuit board when the shielding device is pressed into place, thereby establishing a contact that is both thermally and electrically conductive.

The advantages of the present invention are that an EMC protective casing according to the invention is simple and well suited for automated mass production. Also, for inspection and reparation purposes it is readily opened and re-closed. Naturally, it fulfils the general requirement of adequately shielding the parts inside it against electromagnetic interference.

Figure 1B:
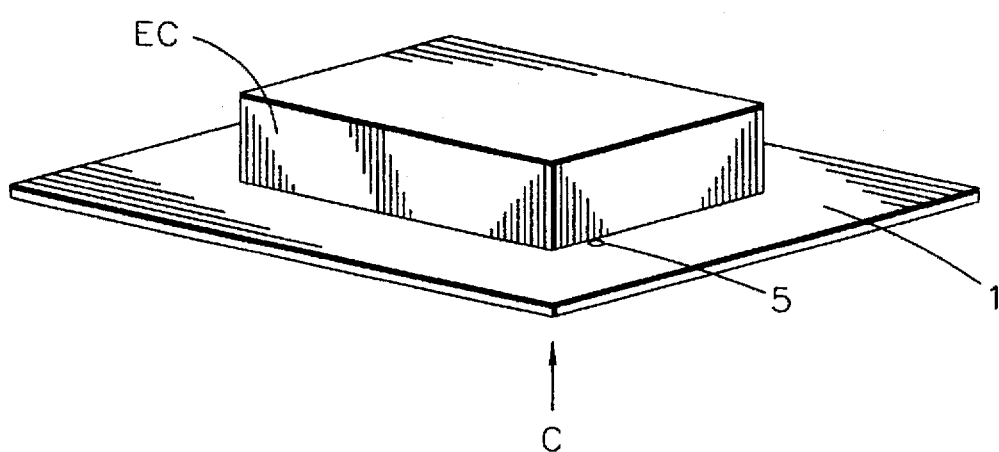
Figure 1C:
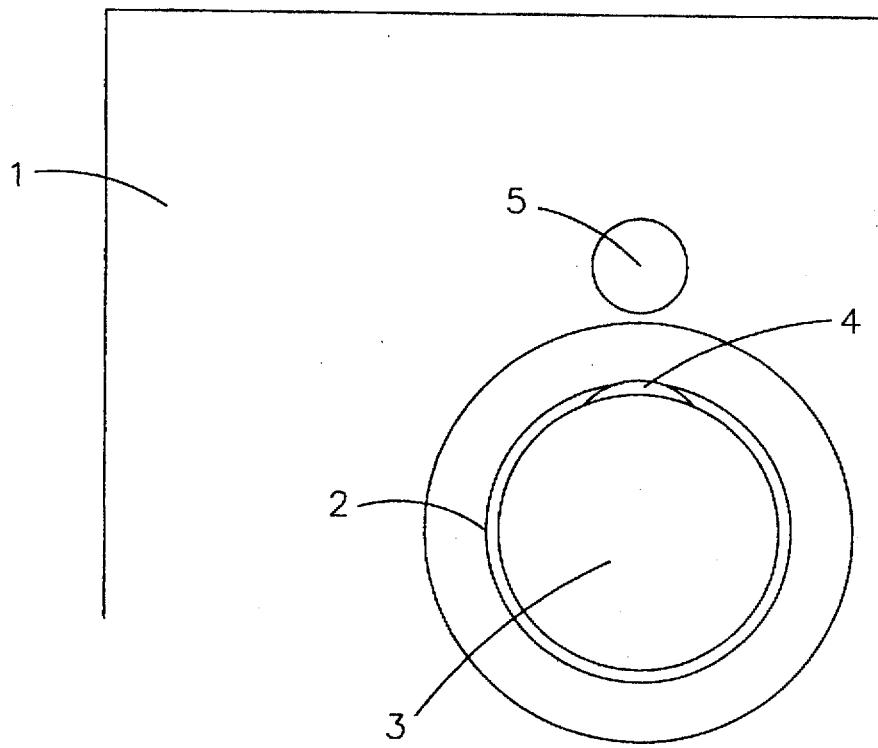
Figure 2:
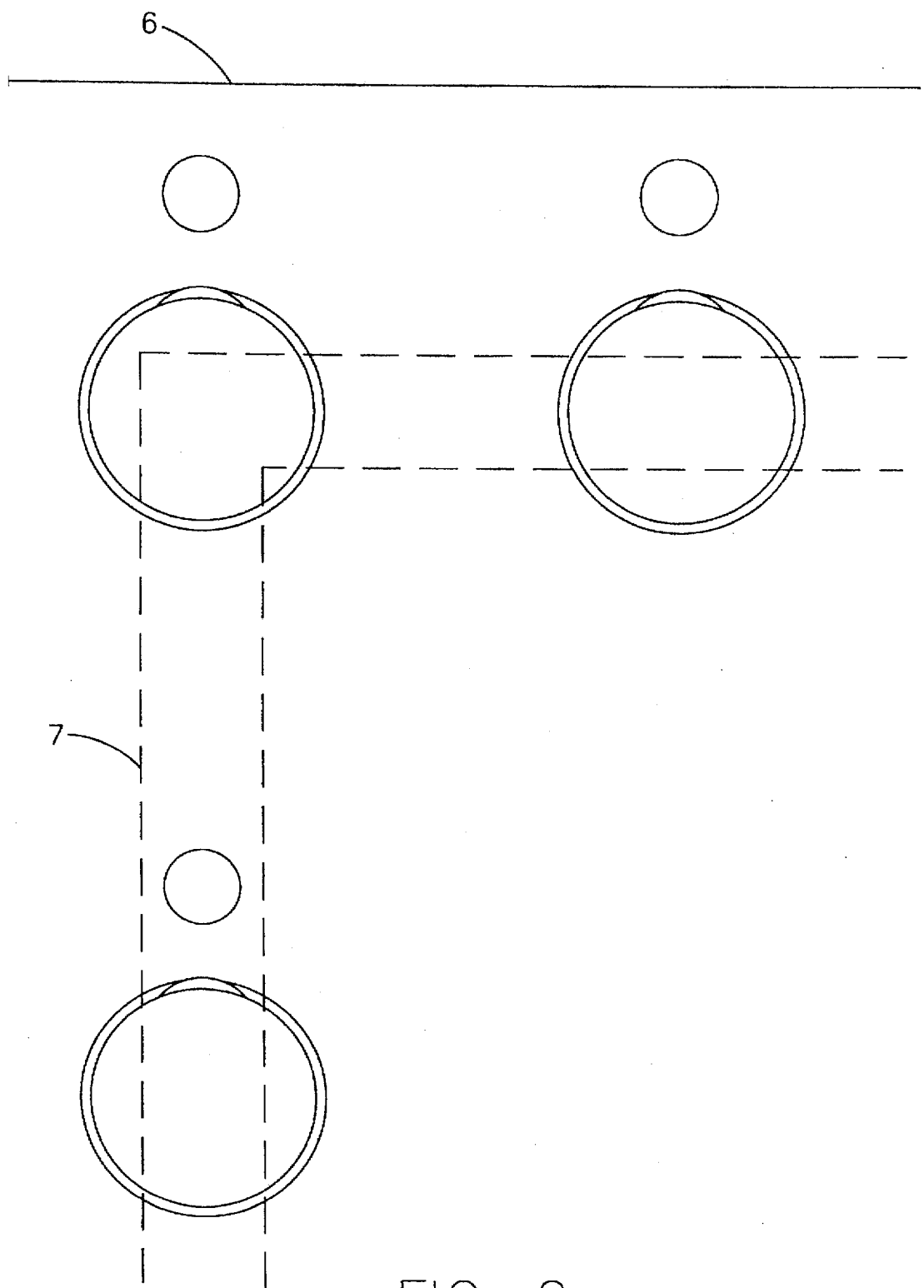

The invention will be described in detail below by way of example only with reference to the accompanying drawings, of which FIG. 1a shows the EMC protective casing according to the invention and a circuit board prior to attaching, FIG. 1b shows the EMC protective casing according to the invention attached to a circuit board, FIG. 1c is a detail of FIG. 1b viewed from direction C, and FIG. 2 shows schematically several attacment pins viewed from below a circuit board.

FIGS. 1a and 1b illustrate attaching the EMC protective casing EC according to the invention to a circuit board. The circuit board 1 is provided with conductively coated openings 2 for fastening the EMC protective casing EC. Conductive coating is shown schematically in grey. Conical pins 3 cast in the EMC protective casing are fit into the openings 2 in the circuit board 1, the protrusions 4 of the pins 3 thus forming a press contact against the timer surface of the opening 2 of the circuit board 1. When necessary, the flexibility of the circuit board 1 can be increased by providing an auxiliary opening 5 on the protrusion side. FIG. 1c is a detail of the arrangement illustrated in FIG. 1b, in which the approximately circular cross-section of a pin 3 can be seen from direction C, that is, from below the circuit board 1. The protrusion 4 bulges outwards from the general shape of the pin 3 and is pressed against the wall of the conductively coated opening 2. Slight flexible deformation is caused in the board and coating materials resulting in a firm press contact between the conductive coating (shown in grey) and the protrusion 4.

The bevelled surface of the pin 3 being wedged into the metal-coated wall of the opening 2, the matching surfaces will be cleaned under the effect of the sliding movement. In this manner, contact will be ensured despite of impurities and oxides, and a hermetic joint will be provided, reducing subsequent oxidation.

The impact of dimension differences on the positioning of the pins 3 into the openings 2 is eliminated by making the contact portion of the pins 3 penetrate the circuit board material to a depth equalling any dimension variation. The metal-coated openings 2 have been confirmed to have adequate malleability.

FIG. 2 shows an advantageous arrangement of the above explained attachment means with respect to each other. The openings are generally made so that the board does not have any critical foil, conductive strip or component near the side against which the protrusion of the pin is pressed. This is to ensure that the slight flexible deformation of the board material does not cause any damage. The protrusion of the pin is made so as to face the edge 6 of the board, if the opening is near the edge 6 like the two top openings in FIG. 2. With the opening not close to the edge, the protrusion is directed parallel to the wall 7 of the protective casing, which is shown as a dashed line in FIG. 2. When necessary, the flexibility of the circuit board is again enhanced by means of an auxiliary opening at the protrusion side of each opening.

The pressing tightness of the pins of the EMC protective casing and the shape of the protrusion can be dimensioned so as to provide a reliable joint. The base of the pins may be rounded in order to provide mechanical strength. In this case, the surface of the EMC protective casing must be suitably designed so that the rounded base of the pins does not leave the casing suspended within a distance from the surface of the circuit board.

An advantageous method of fabricating the EMC protective casing according to the invention is casting. It has been found that the inclusion of attachment pins according to the invention in the design does not cause any significant wear to the mould that is used in the casting process, because the material flows related thereto are small. The pin will retain its shape as long as the mould lasts.

Metal, like aluminium (Al) or magnesium (Mg), may be used as a material in the EMC protective casing according to the invention. The guidability of the protective casing in the assembly phase may be enhanced by providing guide pins.

The fastening method according the invention provides a reliable electric and mechanical joint. Moreover, the EMC protective casing is readily attached and detached, even repeatedly when necessary.

In conclusion, the EMC protective casing according to the invention is economic, easy to manufacture and requires relatively little space on the circuit board. The protective casing according to the invention does not require separate elements for fastening or contact, and it has sufficient thermal conductivity from the circuit board to the protective casing.

We claim:

1. An EMC protective assembly comprising a circuit board (1) and a casing (EC) to be attached to said circuit board (1), characterized in that said circuit board (1) is provided with conductively coated openings (2) for fastening said EMC protective casing, and that said EMC protective casing (EC) is provided with integral attachment pins (3), to be inserted into said openings (2) in the circuit board (1), said attachment pins being conical in shape and at least one of said attachment pins comprising a protrusion (4) extending outwards from the otherwise regular surface of the pin (3), in order to produce a contact between the surface of said protrusion (4) and the inner surface of the respective opening (2) in the circuit board (1) when said EMC protective casing (EC) is attached to said circuit board (1).

2. An EMC protective casing (EC) as claimed in claim 1, characterised in that said pins (3) are essentially convex in shape, and the surface of said protrusion (4) is bevelled with respect to the longitudinal axis of the respective pin (3), in order to said protrusion (4) be wedged against the inner surface of the respective opening (2) in the circuit board (1), thereby producing a cleaning movement of the contacting surfaces, when said EMC protective casing (EC) is attached to said circuit board (I) by inserting each pin (3) into the respective opening (2).

3. An EMC protective casing (EC) as claimed in claim 1, characterized in that the pins (3) have a contact portion and the contact portions of the pins (3) penetrate the circuit board material to a depth sufficient to account for variations in the positioning of the pins relative to said openings.

4. An EMC protective casing (EC) as claimed in claim 1, characterised in that those pins (3) that are to be inserted into openings that are near an edge (6) of said circuit board (1) are made such that the protrusion (4) of the pin (3) is directed towards said edge of the board (1).

5. An EMC protective casing (EC) as claimed in claim 1, characterised in that those pins (3) that are to be inserted into openings that are not near an edge (6) of said circuit board (1) are made such that the protrusion (4) of the pin (3) is directed parallel to the wall of the EMC protective casing.

6. An EMC protective casing (EC) as claimed in claim 1, characterised in that it comprises guide pins to be inserted into respective guiding holes in said circuit board, in order to enhance the guidability of the EMC protective casing in assebly.

7. An EMC protective casing (EC) as claimed in claim 1, characterised in that it is made of metal.

8. An EMC protective casing (EC) as claimed in claim 7, characterised in that it is made of aluminium (Al).

9. An EMC protective casing (EC) as claimed in claim 7, characterised in that it is made of magnesium (Mg).

10. An EMC protective casing (EC) as claimed in claim 1, characterised in that it is made by casting.

11. A method for fastening an EMC protective casing (EC) to a circuit board (1), characterized in that openings (2) are provided in said circuit board, attachment pins (3) are provided as integral parts of said EMC protective casing, said attachment pins being provided as conically shaped members, a protrusion (4) is formed in at least one of said attachment pins (3), said EMC protective casing is attached to said circuit board (1) by inserting at least one of the attachment pins (3) into a respective opening (2) in said circuit board (1), said EMC protective casing is pressed against said circuit board (1), thereby bringing the surface of said protrusion (4) into contact with the inner surface of the respective opening (2).

12. A method as claimed in claim 11, characterised in that the pressing force that is used to press said EMC protective casing against said circuit board is dimensioned such as to produce a relative sliding movement between the surface of said protrusion (4) and the inner surface of the respective opening (2) and to cause a local deformation of the material of said circuit board (1).

13. A method as claimed in claim 11, characterised in that the flexibility of the circuit board (1) is enhanced by providing an auxiliary opening (5) near the point that will come into contact with said protrusion (4).

14. A method as claimed in any of claim 1, characterised in that the openings (2) are made so that on the circuit board, there is no critical foil or component near the side of the opening (2) against which the protrusion (4) of the pin (3) is pressed.

* * * * *